(12) United States Patent
Du et al.

(10) Patent No.: US 11,728,228 B2
(45) Date of Patent: *Aug. 15, 2023

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Mengmeng Du, Beijing (CN); Xiangdan Dong, Beijing (CN); Hongwei Ma, Beijing (CN); Biao Liu, Beijing (CN); Bo Zhang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 214 days.

This patent is subject to a terminal disclaimer.

(21) Appl. No.: 17/276,624

(22) PCT Filed: May 12, 2020

(86) PCT No.: PCT/CN2020/089818
§ 371 (c)(1),
(2) Date: Mar. 16, 2021

(87) PCT Pub. No.: WO2021/226833
PCT Pub. Date: Nov. 18, 2021

(65) Prior Publication Data
US 2022/0115280 A1 Apr. 14, 2022

(51) Int. Cl.
*H01L 21/66* (2006.01)
*H02H 9/04* (2006.01)
*H10K 59/131* (2023.01)

(52) U.S. Cl.
CPC ............ *H01L 22/34* (2013.01); *H02H 9/046* (2013.01); *H10K 59/131* (2023.02)

(58) Field of Classification Search
CPC ..... H01L 22/34; H01L 27/3276; H01L 27/12; H02H 9/046; G09G 3/006; G09G 2310/0297; G02F 1/13; G02F 1/133
(Continued)

(56) References Cited

U.S. PATENT DOCUMENTS 7,489,366 B2 * 2/2009 Liu ..................... G09G 3/20
349/40
10,409,121 B2 * 9/2019 Peng ................. H10K 59/123
(Continued)

FOREIGN PATENT DOCUMENTS

CN 110908200 A * 3/2020 ......... G02F 1/13452

*Primary Examiner* — Dharti H Patel
(74) *Attorney, Agent, or Firm* — WHDA, LLP

(57) ABSTRACT

A display substrate and a display apparatus are provided, the display substrate includes: a base substrate including a display area and a peripheral area surrounding the display area; a plurality of sub-pixel units in the display area; a plurality of data lines in the display area and electrically coupled to the plurality of sub-pixel units; a plurality of data transmission lines in the peripheral area on at least one side of the display area and electrically coupled to the plurality of data lines; a plurality of first pads and a plurality of second pads located between the plurality of first pads and the plurality of data transmission lines; a plurality of third pads between the plurality of first pads and the plurality of second pads; and a plurality of multiplexers between the plurality of second pads and the plurality of third pads.

20 Claims, 10 Drawing Sheets

(58) Field of Classification Search
USPC .......................................................... 361/56
See application file for complete search history.

(56) References Cited

U.S. PATENT DOCUMENTS

| | | | |
|---|---|---|---|
| 2014/0211117 A1* | 7/2014 | Choi | G02F 1/13458 438/158 |
| 2016/0379906 A1* | 12/2016 | Kim | G09G 3/3688 257/48 |
| 2020/0203453 A1* | 6/2020 | Kim | H05K 1/18 |
| 2021/0142702 A1* | 5/2021 | Lee | G09G 3/006 |
| 2021/0248938 A1* | 8/2021 | Lee | G09G 3/20 |
| 2022/0384556 A1* | 12/2022 | Zhang | H10K 59/131 |

* cited by examiner

DISPLAY PANEL AND DISPLAY APPARATUS

CROSS-REFERENCE TO RELATED APPLICATION(S)

This application is a Section 371 National Stage application of International Application No. PCT/CN2020/089818, filed on May 12, 2020.

TECHNICAL FIELD

The present disclosure relates to a field of display technologies, and in particular to a display panel and a display apparatus.

BACKGROUND

With advancements of display technologies, Organic Light-emitting Diode (OLED) display apparatuses are one of hotspots in a research field of tablet display apparatuses, and OLED display light-emitting apparatuses have advantages of bright colors, good viewing angles, high contrast, fast response speed, bendable, and low power consumption, and the like, which have attracted people's attention. OLED display apparatuses, especially Active Matrix Organic Light-emitting Diode (AMLOED) display apparatuses, have broader application prospects in a future display field, and they have broad application space in multiple display fields such as mobile displays, vehicle displays, and medical displays.

In order to improve a product yield of the OLED display apparatuses, it may be necessary to perform some tests at different stages of producing processes of the display apparatus, and determine whether finished products or semi-finished products manufactured at current stage is qualified or not based on test results, and if they are not qualified, they may be repaired or discarded according to an actual situation. This manner may prevent the semi-finished products that have already had unqualified problems in previous stages from directly entering a next stage of the process without being processed, thereby saving costs and improving yield.

SUMMARY

Embodiments of the present disclosure provide a display substrate, comprising: a base substrate comprising a display area and a peripheral area surrounding the display area; a plurality of sub-pixel units in the display area; a plurality of data lines in the display area and electrically coupled to the plurality of sub-pixel units, respectively; a plurality of data transmission lines in the peripheral area on at least one side of the display area and electrically coupled to the plurality of data lines, respectively; a plurality of first pads and a plurality of second pads on a side of the plurality of data transmission lines away from the display area, wherein the plurality of first pads and the plurality of second pads extend in a direction of a boundary of the display area, respectively, and the plurality of second pads are between the plurality of first pads and the plurality of data transmission lines and are electrically coupled to the plurality of data transmission lines; a plurality of third pads between the plurality of first pads and the plurality of second pads, wherein at least part of the plurality of third pads are electrically coupled to the plurality of second pads; a plurality of multiplexers between the plurality of second pads and the plurality of third pads, wherein at least one of the plurality of multiplexers is electrically coupled to at least two of the plurality of second pads and one of the plurality of third pads.

In some embodiments, at least one of the plurality of multiplexers comprises: a first thin film transistor and a second thin film transistor, and the first thin film transistor comprises a first source, a first drain, and a first gate, the second thin film transistor comprises a second source, a second drain, and a second gate; and wherein one of the first source and the first drain and one of the second source and the second drain are electrically to a same pad in the plurality of third pads, another of the first source and the first drain is electrically coupled to one of the plurality of second pads, and another of the second source and the second drain is electrically coupled to another pad of the plurality of second pads; and wherein the first gate is electrically coupled to a first control line, and the second gate is electrically coupled to a second control line, the first control line is configured to access a first level signal, the second control line is configured to access a second level signal, and the first level signal and the second level signal are configured to turn off the first gate and the second gate in the multiplexer during a display stage of the display substrate.

In some embodiments, the plurality of third pads further comprises: a first control terminal pad, a first control terminal pad electrically coupled to the first control line; and a second control terminal pad electrically coupled to the second control line.

In some embodiments, the display substrate further comprises a first level signal line and a second level signal line between the plurality of first pads and the plurality of third pads, wherein the plurality of first pads comprise at least one first level input pad and at least one second level input pad, and the at least one first level signal line is electrically coupled to one of the first control terminal pad and the second control terminal pad and the at least one first level input pad, and the second level signal line is electrically coupled to another of the first control terminal pad and the second control terminal pad and the at least one second level input pad.

In some embodiments, the display substrate further comprises a first level connection portion and a second level connection portion, wherein a number of the at least one first level input pad is multiple, and a number of the at least one second level input pad is multiple; and wherein the first level connection portion is between the plurality of first level input pads and the first level signal line, and is electrically coupled to the first level signal line and the plurality of first level input pads; and the second level connection portion is between the plurality of second level input pads and the second level signal line, and is electrically coupled to the second level signal line and the plurality of second level input pads.

In some embodiments, the first level connection portion and the first level signal line are in an integrated structure, and the second level connection portion and the second level signal line are in an integrated structure.

In some embodiments, the first level signal is a positive voltage signal or a negative voltage signal, and the second level signal is a positive voltage signal or a negative voltage signal.

In some embodiments, a numerical range of the positive voltage signal is between 6V to 8V, and a numerical range of the negative voltage signal is between −8V to −6V.

In some embodiments, the first control line, the second control line, the first level signal line, the second level signal line, the gate of the first thin film transistor, and the gate of the second thin film transistor are made of a same material and are arranged on a same layer.

In some embodiments, the plurality of third pads are configured to input test signals to the plurality of sub-pixel units, and the plurality of first pads and the plurality of second pads are configured to be bound with a same integrated circuit device.

In some embodiments, the display substrate further comprises a third level signal line and a fourth level signal line; and a plurality of electrostatic discharge structures, wherein the third level signal line is configured to provide a positive level signal, and the fourth level signal line is configured to provide a negative level signal, and wherein at least one of the electrostatic discharge structures comprises: a third thin film transistor, wherein a gate of the third thin film transistor is electrically coupled to the third level signal line, one of a source and a drain of the third thin film transistor is electrically coupled to the third level signal line, and another of the source and the drain of the third thin film transistor is electrically coupled to a corresponding pad in the plurality of third pads; a fourth thin film transistor, wherein a gate of the fourth thin film transistor is electrically coupled to the third level signal line, one of a source and a drain of the fourth thin film transistor is electrically coupled to the third level signal line, and another of the source and the drain of the fourth thin film transistor is electrically coupled to a corresponding pad in the plurality, of third pads; a fifth thin film transistor, wherein a gate of the fifth thin film transistor is electrically coupled to a corresponded pad in the plurality of third pads, one of a source and a drain of the fifth thin film transistor is electrically coupled to the fourth level signal line, and another of the source and the drain of the fifth thin film transistor is electrically coupled to a corresponding pad in the plurality of third pads; and a sixth thin film transistor, wherein a gate of the sixth thin film transistor is electrically coupled to a corresponding pad in the plurality of third pads, one of a source and a drain of the sixth thin film transistor is electrically coupled to the fourth level signal line, and another of the source and the drain of the sixth thin film transistor is electrically coupled to a corresponding pad in the plurality of third pads.

In some embodiments, both the third thin film transistor and the fourth thin film transistor comprise an active layer; and wherein the gate of the third thin film transistor and the gate of the fourth thin film transistor comprise a first bar-like sub-gate and a second bar-like sub-gate; and wherein one of the source and the drain of each of the third thin film transistor and the fourth thin film transistor has a first arm portion and a second arm portion coupled to each other, the first arm portion extends in a first direction, and the second arm portion extends in a second direction crossing the first direction, the first arm portion is coupled to the active layer through a first via hole, and the second arm portion is coupled to the first bar-like sub-gate through a second via hole structure and is coupled to the second bar-like sub-gate through a third via hole.

In some embodiments, the electrostatic discharge structure further comprises: a first connection portion and a second connection portion; and wherein the first connection portion and the active layer are made of a same material and are arranged on a same layer, and the second connection portion and the source and the drain are made of a same materiel and are arranged on a same layer; and wherein the first connection portion is coupled to one of the source and the drain of each of the third thin film transistor and the fourth thin fiber transistor through the third via hole structure, the first connection portion is coupled to the second connection portion through a fourth via hole, and the second connection portion is coupled to the third level signal line through a fifth via hole structure.

In some embodiments, at least one of the plurality of sub-pixel units comprises a pixel circuit and a light-emitting element, the pixel circuit is between the base substrate and the light-emitting element; and wherein the light-emitting element comprises a first electrode, a light-emitting layer, and a second electrode stacked in sequence, and the second electrode is located on a side of the light-emitting layer facing the base substrate; and wherein the pixel circuit comprises at least one thin film transistor, the thin film transistor comprises a gate on the base substrate, a source and a drain on a side of the gate away from the base substrate, and the source or the drain of the thin film transistor is electrically coupled to the second electrode; and the source and the drain of the at least one thin film transistor are arranged on a same layer with the plurality of first pads, the plurality of second pads, and the plurality of third pads.

In some embodiments, the first level connection portion, the first level signal line, the second level connection portion, the second level signal line, and the gate of the thin film transistor in the pixel circuit are located on a same layer.

In some embodiments, the display substrate is a bendable substrate, the display substrate comprises a bendable area, and the plurality of second pads are far away from the display area than the bendable area.

The embodiments of the present disclosure further provide a display apparatus, comprising: the display substrate according to any embodiment stated above; and an integrated circuit device, the integrated circuit device is bound with the plurality of first pads and the plurality of second pads.

In some embodiments, an orthographic projection of the integrated circuit device on the base substrate at least partially overlaps orthographic projections of the plurality of third pads on the base substrate.

In some embodiments, the plurality of multiplexers are configured to be turned off when the display apparatus is operating.

BRIEF DESCRIPTION OF THE DRAWINGS

Other features, purposes and advantages of the present disclosure will become apparent with reference to the description below to the non-limited embodiments with reference to the drawings.

DETAILED DESCRIPTION OF EMBODIMENTS

Figure 1:
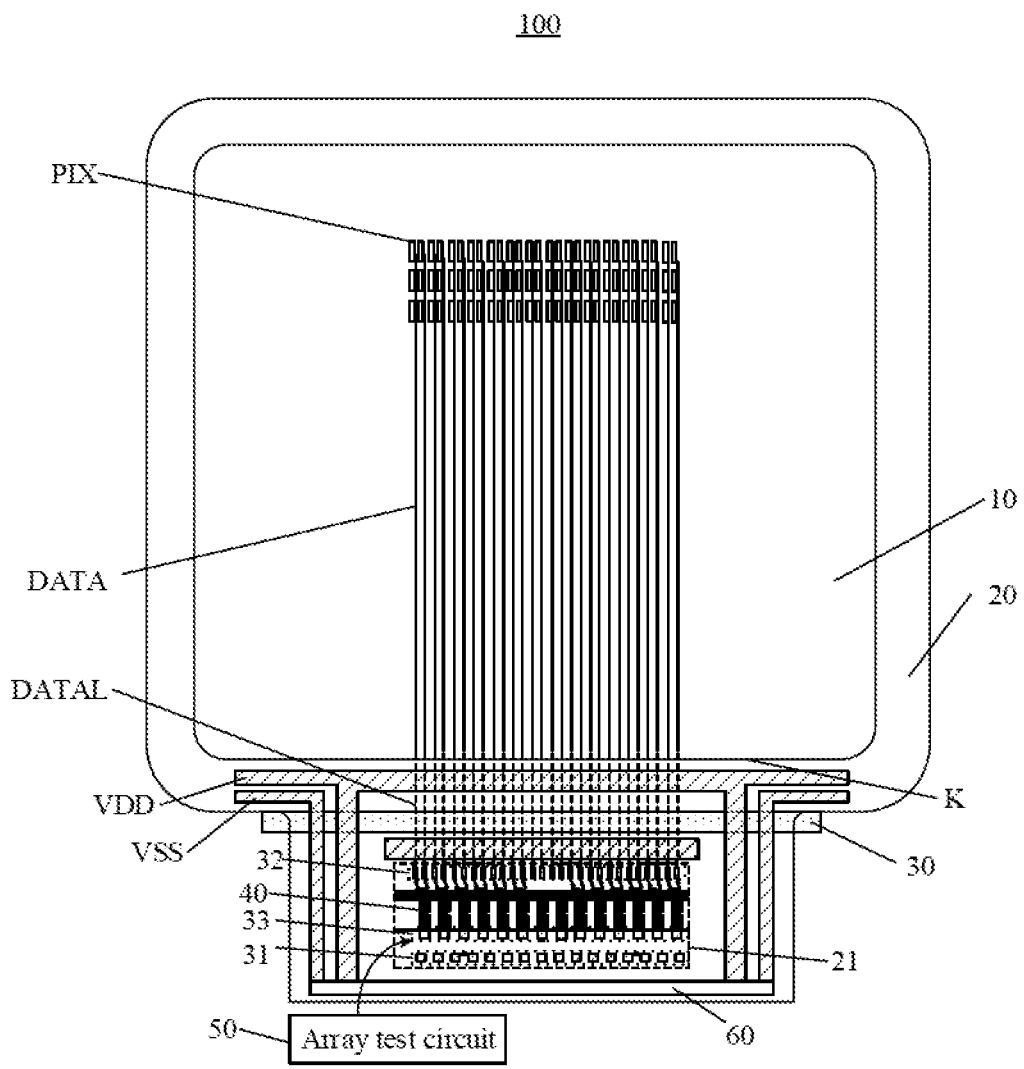
FIG. 1 is a schematic view of the display substrate according to some embodiments of the present disclosure.

The present disclosure will be further described in detail below with reference to the drawings and embodiments. It may be understood that the specific embodiments described herein are merely used to explain the related art, and should not limit the present disclosure. In addition, it should be noted that for ease of description, only parts related to the present disclosure are shown in the drawings.

It should be noted that the embodiments of the present disclosure and features in the embodiments may be combined with each other if there is no conflict.

In addition, in the detailed description below, for ease of description, many specific details are set forth to provide a comprehensive understanding of the embodiments of the present disclosure. However, it is obvious that one or more embodiments may also be implemented without these specific details.

It should be understood that although terms "first", "second" may be used to describe different elements here, however, these elements should not be limited by these terms. These terms are merely used to distinguish one element from another element. For example, without departing from the scope of the present disclosure, the first element may be named as the second element, and similarly, the second element may be named as the first element. The term "and/or" as used here includes any or all combinations of one or more related listed items.

It should be understood that when an element or a layer is referred to as being "formed on" another element or layer, the element or layer may be directly or indirectly formed on the another element or layer. That is, for example, there may be an intermediate element or an intermediate layer. In contrast, when an element or a layer is referred to as being "directly formed on" another element or layer, there is no intervening element or layer. Other terms used to describe the relationship (for example, "between" and "directly between", "adjacent" and "directly adjacent", etc.) between elements or layers should be interpreted in a similar manner.

The terms used herein are only for a purpose of describing specific embodiments, and are not intended to limit the embodiments. As used herein, unless the context clearly dictates otherwise, the singular form is also intended to include the plural form. It should also be understood that when terms "comprising" and/or "including" are used herein, it means that the described features, wholes, steps, operations, elements and/or components are present, but the presence or addition of one or more other features, wholes, steps, operations, elements, components, and/or combinations thereof are not excluded.

In present disclosure, unless otherwise specified, expressions "located on the same layer" and "arranged on the same layer" generally indicate that the first component and the second component may use the same material and may be formed by the same patterning process. Expressions "located on different layers" and "arranged on different layers" generally indicate that the first component and the second component are formed by different patterning processes.

In a manufacturing process of a display panel, it is necessary to continuously detect quality problems of products, and timely screen out unqualified products during a test process, so as to adjust processes in time to realize a production with a high yield and a low cost. Since materials or components of a light-emitting layer and a driving integrated circuit, etc. are relatively expensive, electrical properties may be tested before evaporating light-emitting materials and binding a circuit device (such as an integrated circuit device, etc.), only if semi-finished products may meet quality requirements, they may enter a next stage of a process. Commonly used detection method to detect whether the electrical properties of the panel are defective or not before evaporating the light-emitting materials is called AT test (array test).

During the AT test, the test signal needs to be input into the TFT (thin film transistor) array in the display substrate to detect whether the electrical properties of each part of the display substrate meet the requirements or not, such as whether an on-off of a circuit is consistent with a design or not. For a COF encapsulated display panel, due to having a FPC (flexible circuit board), it is usually possible to directly access the test signal through cables of the flexible circuit board and input the test signal to the TFT array in the display substrate. However, as a demand for a narrow flame of the display panel becomes higher, for some display panels, the cables may no longer be arranged on the display substrate or the test signal may not be accessed to the TFT array only through the cables as desired due to a problem of a circuit connection relationship.

For example, FIG. 1 shows an example of the display substrate 100. The display substrate 100 is applied to a COP display apparatus. A display area 10 and a peripheral area 20 are provided on the display substrate. The display area 10 is used to display images, for example, the display area may include a plurality of sub-pixel units PIX (for example, the sub-pixel units may be arranged in an array). The peripheral area 20 is located at a periphery of the display area 10 (for example, may be arranged around the display area 10), and is used to lay out peripheral circuits (for example, a driving integrated circuit device, connection lines, etc.), and the like. A dimension of a frame of the display apparatus is limited by a size and a layout of the peripheral area 20 to a great extent. For a design of the display apparatus, in the peripheral area 20 on each side of the display area, there is usually an area of the peripheral area 20 integrating the most circuit elements, which requires a larger area. As shown in the example of FIG. 1, the peripheral area is located below the display area in FIG. 1. For reducing a restriction of the peripheral area to the narrowing of the frame of the display apparatus, the display substrate is provided with a bendable area 30 in the peripheral area 20. The bendable area 30 is flexible. In a final product, the bendable area 30 is bendable, so that a part of the peripheral area of the display substrate may be folded to a side of the display apparatus opposite to a display surface, thereby reducing a width of the frame. It should be understood that circuit structures in the display area 10 and the peripheral area 20 described above may be carried both on a base substrate 1 (with reference to FIG. 10). In the peripheral area 20, for example, a high-level signal line VDD and a low-level signal line VSS may be provided to provide level signals for an array test assembly 40. As an example, the peripheral area 20 may also be provided with an interface 60 coupled to the flexible print circuit board. A plurality of data lines DATA may also be provided in the display area 10, and electrically coupled to a plurality of sub-pixel units PIX, respectively. The DATA lines are used to provide required data driving signals for each sub-pixel unit PIX. A plurality of data transmission lines DATAL (as shown by dashed lines in FIG. 1) are provided in the peripheral area 20 on at least one side of the display area 10 and are electrically coupled to the plurality of data lines DATA, respectively, for transmitting signals between the peripheral circuit and the data lines DATA of the display substrate.

A foldable portion of the display substrate is usually provided with an interface coupled to the external circuit of the display substrate and related lines. In the example of FIG. 1, the peripheral area 20 includes an integrated circuit device layout area 21, as shown by a dashed frame in FIG. 1. The integrated circuit device layout area 21 is used to lay out an integrated circuit device, and accordingly, a plurality of first pads 31 and a plurality of second pads 32 are provided in the integrated circuit device layout area 21. The plurality of first pads 31 and the plurality of second pads 32 may be used for bonding with the integrated circuit device. The plurality of first pads 31 may be used to be electrically coupled to input signals of the integrated circuit devices, the plurality of second pads 32 may be used to be electrically coupled to output signals of the integrated circuit devices. The plurality of first pads 31 and the plurality of second pads 32 may be, for example, located on a side of the plurality of the data transmission lines DATAL away from the display area 10. The plurality of first pads 31 and the plurality of second pads 32 extend in a direction of a boundary K of the display area 10. The plurality of second pads 32 may be located between the plurality of first pads 31 and the plurality of data transmission lines DATAL, and are electrically coupled to the plurality of data transmission lines DATAL. When the integrated circuit device is installed in the integrated circuit device layout area 21, the plurality of first pads 31 and the plurality of second pads 32 may be electrically coupled (for example, via a manner such as welding, etc.) to corresponding input pins and output pins of the integrated circuit (IC) device. For example, the integrated circuit device may provide a signal on the data line DATA for each sub-pixel unit in the display area 10 when the display apparatus is operating, which means at least some pins of the integrated circuit device are electrically coupled to circuits of each sub-pixel unit, and thus in the manufacturing process of the display substrate, some test signals may be input from the pins to detect whether any manufacturing defect exists in a driving circuit of the sub-pixel unit or not. For testing the electrical properties after a module process (MDL), since the integrated circuit device is installed in the integrated circuit device layout area 21 at this time, the test signals may be input from corresponding pads of the plurality of first pads 31 to the integrated circuit device, and transferred to each sub-pixel unit in the display area 10 via the output terminal of the integrated circuit device, so as to realize testing of the electrical properties.

However, for the AT test described above, the situation is different. As mentioned earlier, the AT test is performed before manufacturing the light-emitting layer and installing the integrated circuit device. Therefore, when the AT test is performed, the integrated circuit device is not installed. Therefore, it is impossible to use the plurality of first pads 31 for the AT test.

For this, an array test assembly 40 is provided in the integrated circuit device layout area 21 on the display substrate according to the embodiments of the present disclosure. The array test assembly 40 is located between the plurality of first pads 31 and the plurality of second pads 32. After the integrated circuit device is installed, at least most part of the array test assembly 40 may be covered by the integrated circuit device, which means that the array test assembly 40 may not increase an additional wiring area of the display substrate. The layout of the array test assembly 40 makes full use of a gap between the first pad 31 and the second pad 32 in the integrated circuit device layout area 21, which is very helpful for reducing the wiring area. In addition, since the array test assembly 40 is only used for the AT test, it may not be covered by the integrated circuit device in subsequent processes and may not have any adverse effect on functions of the device.

In the embodiments according to the present disclosure, the array test assembly 40 may include a plurality of third pads 33 electrically coupled to the array test circuit and a plurality of connection terminals 41 electrically coupled to the plurality of second pads 32. The plurality of third pads 33 may be used to electrically couple with an external array test circuit 50. The array test circuit 50 is used to provide a test signal for the AT test, and the test signal may be, for example, a level signal to test whether the circuit has defects such as an open circuit or a short circuit or not, or may be other specific signals used to test the electrical properties of the TFT array. As an example, the array test assembly 40 may include a plurality of test channels, and each test channel is electrically coupled to one or some of the plurality of second pads 32 through one or more connection terminals 41 for the corresponding test. Each test channel obtains a test signal from its corresponding pad in the plurality of third pads 33 and transmits a corresponding test signal to a circuit to be tested via the corresponding connection terminal 41. An electrical coupling between the array test circuit 50 and at least some of the plurality of third pads 33 may be achieved in various ways, for example, by drawing probes from the array test circuit 50 and making the probes contact with the corresponding pads in the plurality of third pads 33, or by drawing input wires from the array test circuit 50 to fixedly connect the corresponding pads in the plurality of third pads 33, and the like. An electrical coupling between the array test circuit 50 and the corresponding pads in the plurality of third pads 33 does not mean that the array test circuit 50 is electrically coupled to all of the plurality of third pads 33 at the same time, for example, the array test circuit 50 may be electrically coupled to only a part of the plurality of third pads 33 (such as one or several pads) at the same time. The plurality of third pads 33 are located between the plurality of first pads 31 and the plurality of second pads 32, and at least part of the plurality of third pads 33 are electrically coupled to the corresponding pads in the plurality of second pads 32. Since at least some of the second pads 32 may be electrically coupled to the data lines DATA in the display area 10, therefore, at least some of the plurality of third pads 33 are electrically coupled to the corresponding second pads 32, which may be used to input test signals to the plurality of sub-pixel units PDC in the display area 10.

Figure 2:
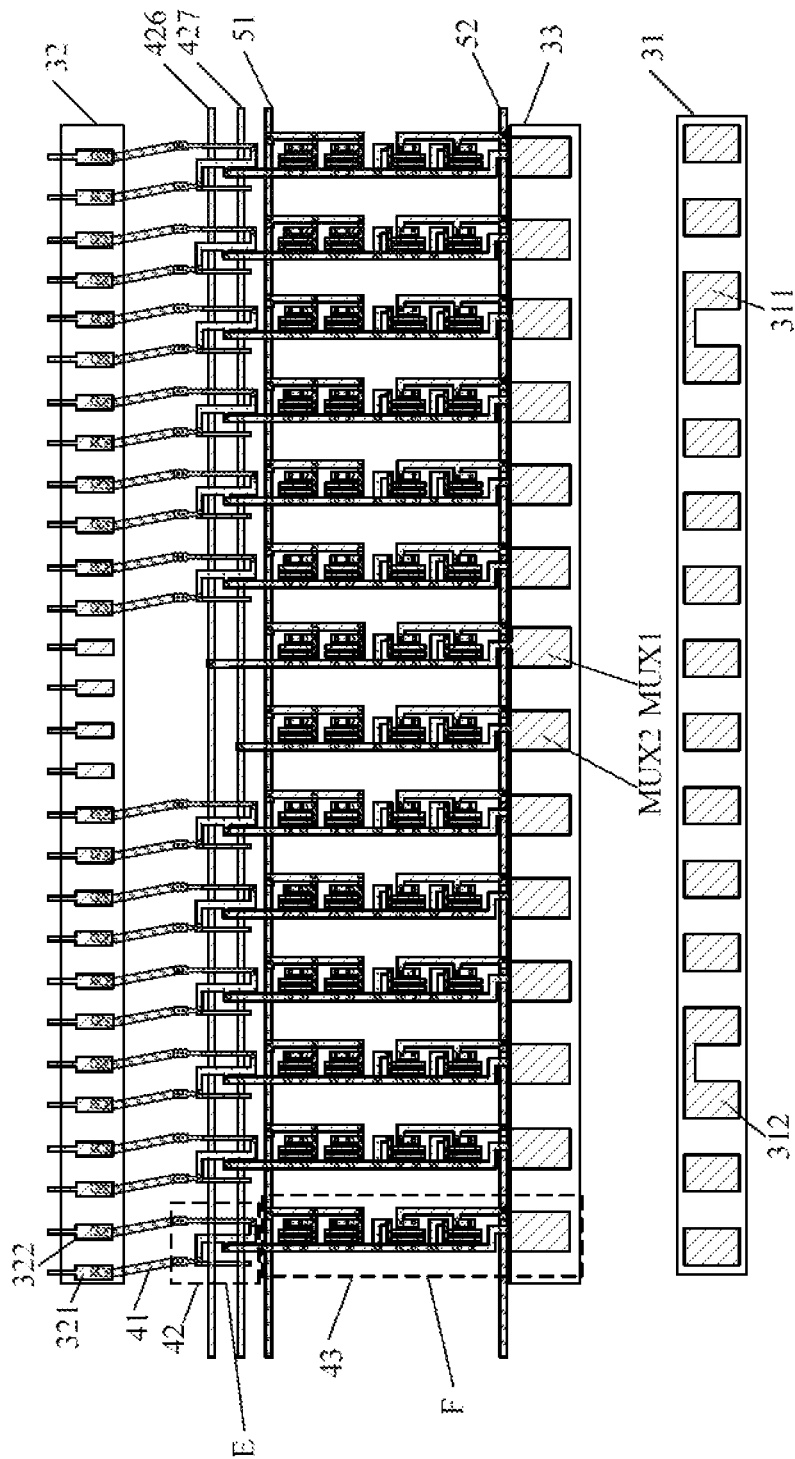
FIG. 2 is an enlarged schematic view of the integrated circuit device layout area in FIG. 1.
Figure 5:
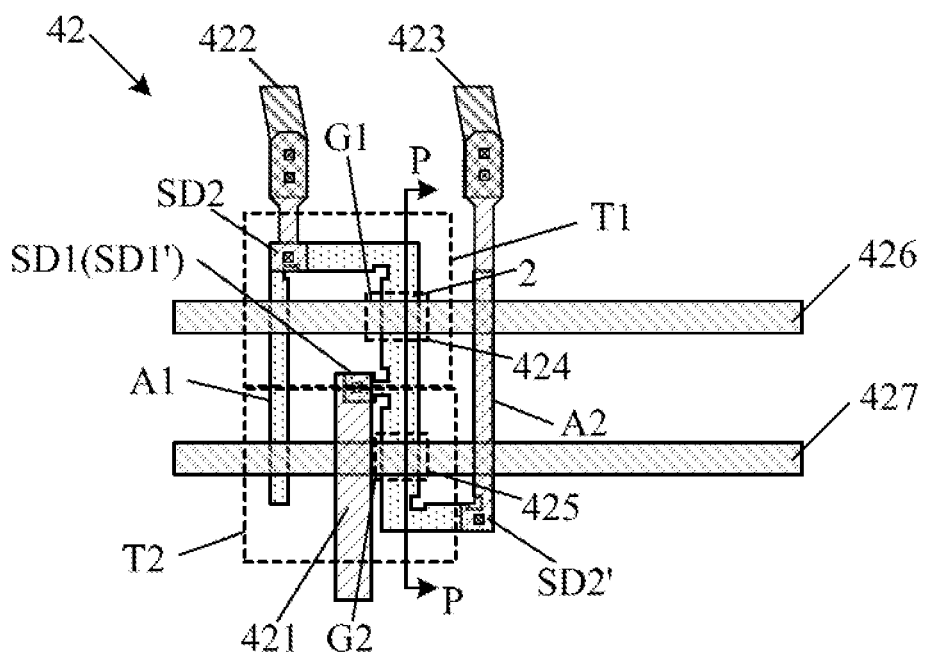
FIG. 5 is an enlarged view of a section E in FIG. 2, and schematically shows a multiplexer in the display substrate according to some embodiments of the present disclosure.

In some embodiments, in order to reduce a number of the plurality of third pads 33 and the wiring area in the array test assembly 40, a plurality of multiplexers 42 may be provided in the array test assembly 40. The plurality of multiplexers 42 may be located between the plurality of second pads 32 and the plurality of third pads 33, and at least one of the plurality of multiplexers 42 is electrically coupled to at least two second pads 32 in the plurality of second pads 32 and one third pad 33 in the plurality of third pads 33. As shown in FIGS. 2 and 5, the at least one multiplexer 42 may include: an input terminal 421, a first output terminal 422, a second output terminal 423, a first control switch 424, and a second control switch 425. The input terminal 421 is electrically coupled to one of the plurality of third pads 33, and the first output terminal 422 is electrically coupled to one pad (may be referred to as a first output pad 321) in the plurality of second pads 32, the second output terminal 423 is electrically coupled to another pad (may be referred to as a second output pad 322) in the plurality of second pads 32. The first control switch 424 is used to control the coupling and decoupling of the input terminal 421 and the first output terminal 422, and the second control switch 425 is used to control the coupling and decoupling of the input terminal 421 and the second output terminal 423. Generally, the multiplexer 42 may be in two states. In a first operating state, the first control switch 424 is turned on and the second control switch 425 is turned off, and a signal input from the input terminal 421 is only provided to the first output terminal 422; and in a second operating state, the first control switch 424 is turned off and the second control switch 425 is turned on, and a signal input from the input terminal 421 is only provided to the second output terminal 423. In this way, if it is possible to alternately control an on-off of the first control switch 424 and the second control switch 425, the multiplexer 42 may be controlled to switch back and forth between the first operating state and the second operating state, thereby it is possible to complete the test for two or more output channels through one input channel. This may reduce the wiring area, which is beneficial to narrow the frame of the display apparatus. It should be noted that the first operating state and second operating state described above are only exemplary. In the embodiments of the present disclosure, the multiplexer 42 may also in other states, for example, a third operating state of both of the first control switch 424 and the second control switch 425 are turned on, and a non-operating state of both of the first control switch 424 and the second control switch 425 are turned off.

In order to control the operations of the first control switch 424 and the second control switch 425, the array test assembly 40 may further include a first control line 426 and a second control line 427. The first control line 426 is electrically coupled to a control terminal of the first control switch 424 of each multiplexer 42, and the second control line 427 is electrically coupled to a control terminal of the second control switch 425 of each multiplexer 42. Signals on the first control line 426 and the second control line 427 may be input from outside, for example, from the plurality of third pads 33. As an example, the plurality of third pads 33 may include: a first control terminal pad MUX1 and a second control terminal pad MUX2. The first control terminal pad MUX1 is electrically coupled to the first control line 426, and the second control terminal pad MUX2 is electrically coupled to the second control line 427. As an example, control signals input from the first control terminal pad MUX1 and the second control terminal pad MUX2 to the first control line 426 and the second control line 427 may be periodic pulse signals or clock signals, and the like.

In some embodiments, the control switch described above may be realized by a thin film transistor structure. For example, as shown in FIG. 2 and FIG. 5, the first control switch 424 may include a first thin film transistor T1, the control terminal of the first control switch 424 is a gate G1 of the first thin film transistor T1, one SD1 (for example, a source) of the source and the drain of the first thin film transistor T1 is electrically coupled to the input terminal 421 of the multiplexer 42, another SD2 (for example, the drain) of the source and the drain of the first thin film transistor T1 is electrically coupled to the first output terminal 422 of the multiplexer 42. The second control switch 425 includes a second thin film transistor T2, the control terminal of the second control switch 425 is a gate G2 of the second thin film transistor T2, one SD1' (for example, a source) of the source and the drain of the second thin film transistor T2 is also electrically coupled to the input terminal 421 of the multiplexer 42, another SD2' (for example, the drain) of the source and the drain of the second thin film transistor T2 is electrically coupled to the second output terminal 423 of the multiplexer 42. In some embodiments, one SD1 of the source and the drain of the first thin film transistor T1 and one SD1' of the source and the drain of the second thin film transistor T2 are electrically coupled to a same pad in the plurality of third pads 33, another one SD2 of the source and the drain of the first thin film transistor T1 is electrically coupled to one of the plurality of second pads 32, and another SD2' of the source and the drain of the second thin film transistor T2 is electrically coupled to another of the plurality of second pads. The gate G1 of the first thin film transistor T1 is electrically coupled to the first control line 426, and the gate G2 of the second thin film transistor T2 is electrically coupled to the second control line 427.

Figure 6:
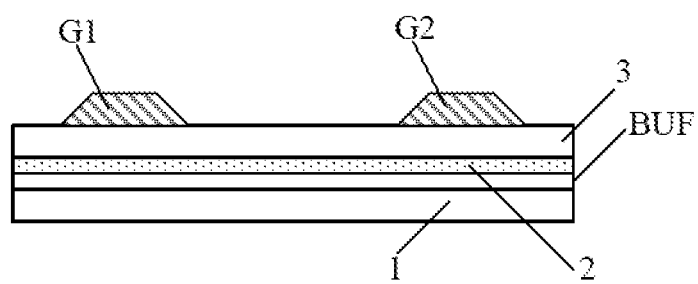
FIG. 6 is a schematic cross-sectional view taken along line P-P in FIG. 5.

FIG. 6 shows a cross-sectional view taken along a line P-P in the above mentioned double-transistor (the first thin film transistor T1 and the second thin film transistor T2) structural view. FIG. 6 shows a base substrate 1, an active layer 2 on the base substrate 1, a gate insulating layer 3 on a side of the active layer 2 away from the base substrate 1, and a gate G1 and a gate G2 on a side of the gate insulating layer 3 away from the active layer 2. As an example, a buffer layer BUF may also be provided between the active layer 2 and the base substrate 1. In the example shown in FIG. 5, portions of the active layer 2 only overlapping the first control line 426 and the second control line 427 are used as channel areas of the first thin film transistor T1 and the second thin film transistor T2, respectively, and other portions of the active layer 2 are used as conductors for electrical coupling. To make structures of the first thin film transistor T1 and the second thin film transistor T2 in the multiplexer 42 more balanced, the first thin film transistor T1 may include a first extension A1, and the second thin film transistor T2 may include a second extension A2. The first extension A1 and the second extension A2 may be arranged in a same layer, for example, in the active layer 2. The first extension A1 is coupled to another SD2 of the source and the drain of the first thin film transistor T1 electrically coupled to the first input terminal 422 of the multiplexer 42, and the second extension A2 is coupled to another SD2' of the source and the drain of the second thin film transistor T2 electrically coupled to the second input terminal 423 of the multiplexer 42. Orthographic projections of the first extension A1 and the second extension A2 on the base substrate 1 overlap an orthographic projection of the first control line 426 on the base substrate 1, and the orthographic projections of the first extension A1 and the second extension A2 on the base substrate 1 overlap an orthographic projection of the second control line 427 on the base substrate 1. An overlapping area of the first extension A1 with the first control line 426 and the second control line 427 is substantially same as an overlapping area of the second extension A2 with the first control line 426 and the second control line 427. This may make parasitic capacitances in the first thin film transistor T1 and the second thin film transistor T2 more consistent, thereby making the test signals output by the two output terminals of the multiplexer 42 more uniform and stable.

Although the multiplexer with two output channels has been described above as an example, it should be understood that the embodiments of the present disclosure are not limited to this, for example, according to actual requirements, a single multiplexer 42 may have more output channels, for example, one input signal may be multiplexed to four, eight or even more output signals to further reduce an area occupied by the array test assembly 40.

As stated above, the array test assembly 40 is only used at a stage of AT testing, and is not effective in subsequent manufacturing stages and a using stage of final products. Therefore, it is hoped that the array test assembly 40 affects the subsequent manufacturing test of the display apparatus and the normal use of the final products as less as possible. Therefore, the plurality of multiplexers 42 described above may be configured to be turned off at the display stage of the display substrate. The plurality of multiplexers 42 described above may also be configured to be turned off at the subsequent manufacturing test stage (for example, a test after light-emitting materials are evaporated, a test after the integrated circuit device is installed, etc.) of the display apparatus. In this way, the plurality of third pads 33 and the data lines DATA may be decoupled at the display stage and at the subsequent manufacturing test stage of the display substrate, so as to prevent an assembly used for the AT test interfering display operations and the subsequent tests of the display substrate. In some embodiments, a first level signal may be access on the first control line 426 and a second level signal may be access on the second control line 427 to make a gate G1 of the first thin film transistor T1 and a gate G2 of the second thin film transistor T2 in the multiplexer 42 turn off during the display stage of the display substrate.

Figure 3:
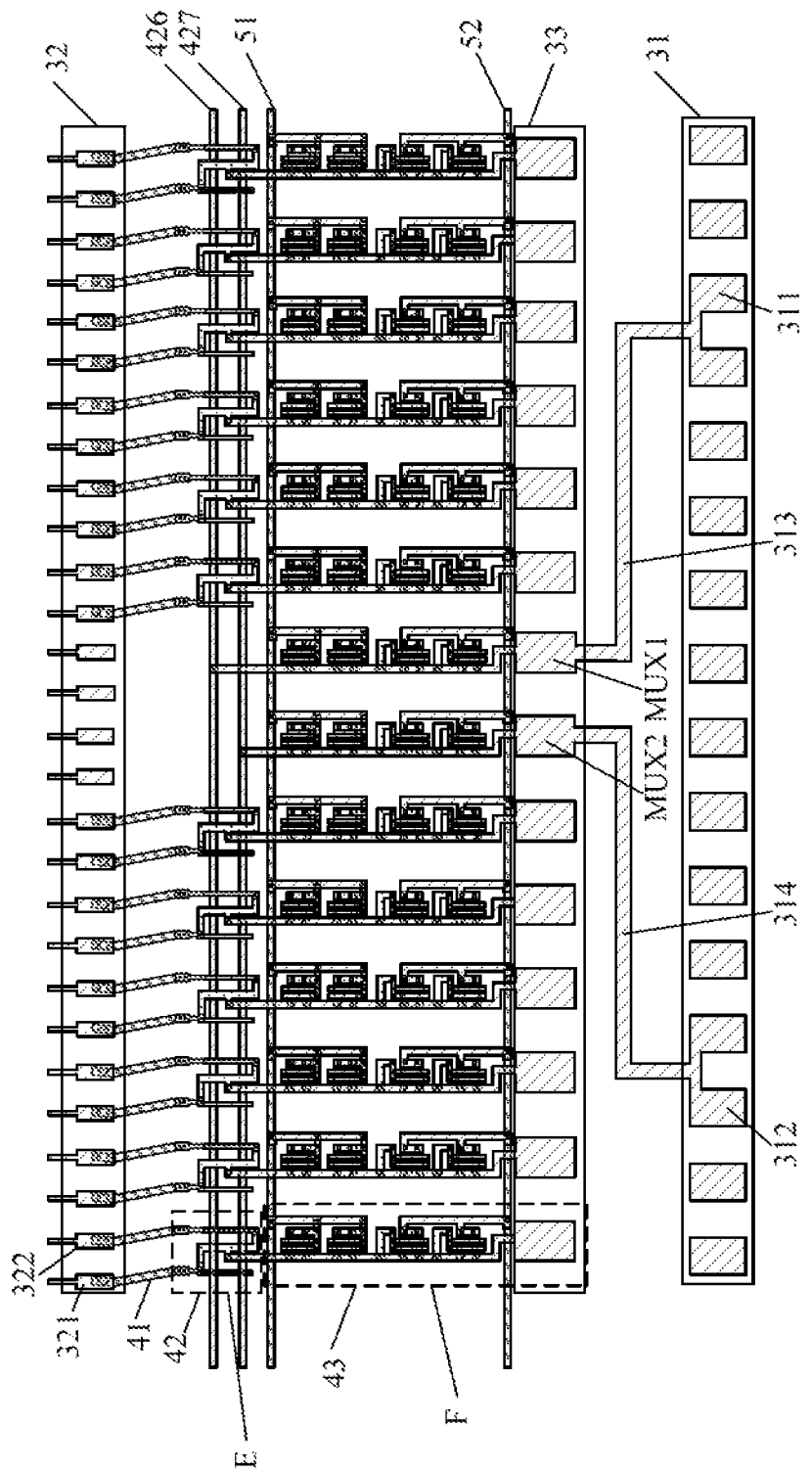
FIG. 3 is a schematic view of the integrated circuit device layout area of the display substrate according to some other embodiments of the present disclosure.

In some embodiments, as shown in FIG. 3, the plurality of first pads 31 described above may include: a first level input pad 311 and a second level input pad 312. A number of the first level input pad 311 and the second level input pad 312 may be one or more. The first level input pad 311 is electrically coupled to the first control terminal pad MUX1 through a first level signal line 313 for accessing the first level signal, and the first level signal keeps the first control switch 424 in the multiplexer 42 off. The second level input pad 312 is electrically coupled to the second control terminal pad MUX2 through a second level signal line 314 for accessing the second level signal, and the second level signal keeps the second control switch 425 in the multiplexer 42 off. As an example, both of the first level signal and the second level signal may be high-level signals (VGH) (for example, positive voltage signals with voltages between 6V and 8V). In an example shown in FIG. 3, two adjacent first level input pads 311 are electrically coupled to each other, and two adjacent second level input pads 312 are also electrically coupled to each other. This facilitates increasing a stability of signals. However, the embodiments of the present disclosure are not limited to this, for example, the first level input pad 311 and the second level input pad 312 may constitute a separate pad, or a plurality of first level input pads 311 electrically coupled to each other and a plurality of second level input pads 312 electrically coupled to each other. Here, the first control terminal pad MUX1 and the second control terminal pad MUX2 only show a sequence, and the first control terminal pad MUX1 and the second control terminal pad MUX2 are interchangeable.

Figure 13:
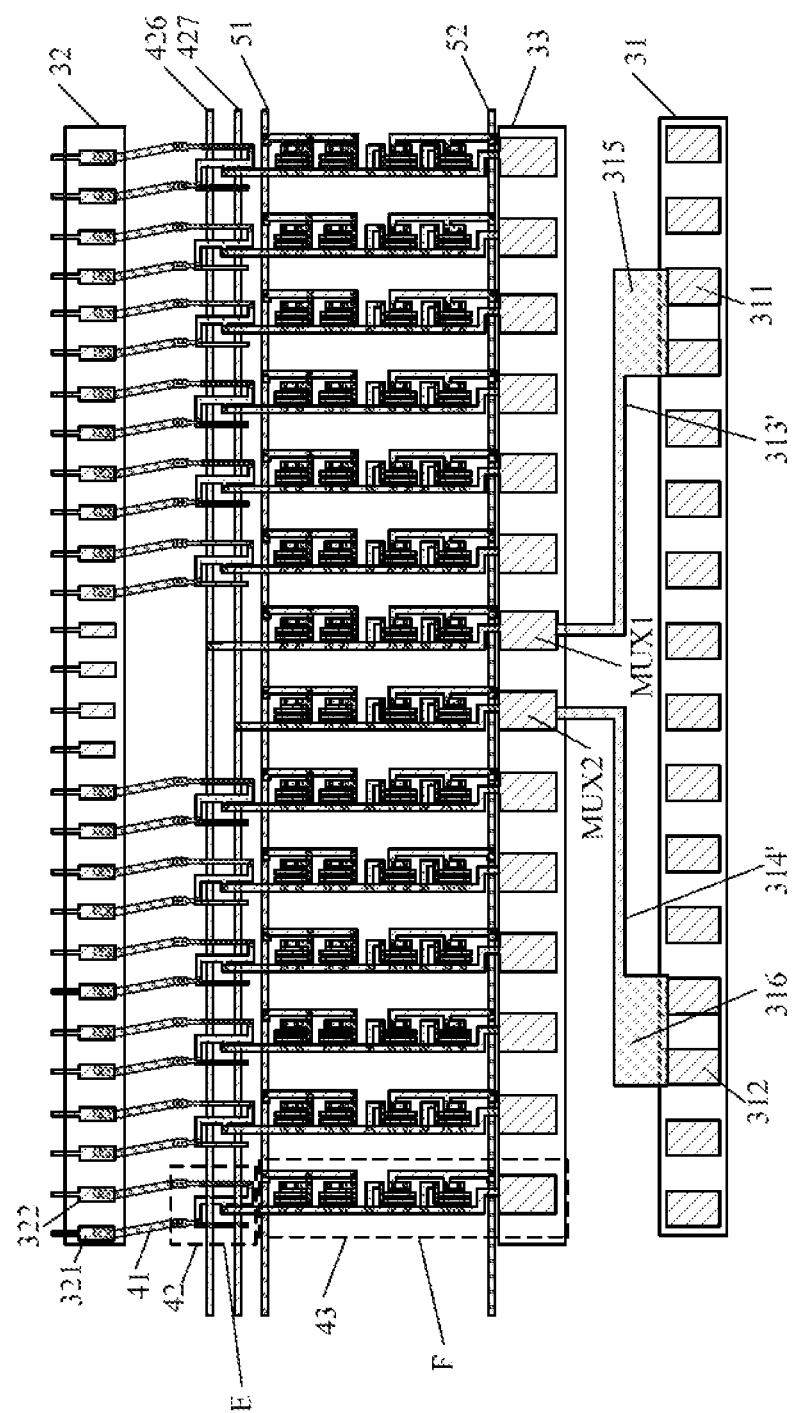
FIG. 13 shows a schematic view of an integrated circuit device layout area of a display substrate according to some further embodiments of the present disclosure.

In some embodiments, as shown in FIG. 13, the display substrate may further include a first level connection portion 315 and a second level connection portion 316, and the number of the first level input pads 311 may be set to multiple, and the number of the second level input pads 312 may also be set to multiple. The first level connection portion 315 is located between the plurality of first level input pads 311 and the first level signal line 313', and is electrically coupled to the first level signal line 313' and the plurality of first level input pads 311; the second level connection portion 316 is located between the plurality of second level input pads 312 and the second level signal line 314', and is electrically coupled to the second level signal line 314' and the plurality of second level input pads 312. As an example, the first level connection portion 315 and the second level connection portion 316 may be arranged on a same layer with the first level signal line 313' and the second level signal line 314', and are arranged on different layers with the first level input pads 311 and the second level input pads 312. For example, the first level connection portion 315 may be electrically coupled to the plurality of first level input pads 311 through a via hole structure, and the second level connection portion 316 may be electrically coupled to the plurality of second level input pads 312 through a via hole structure.

In some embodiments, the first level connection portion 315 and the first level signal line 313' may be an integrated structure, and the second level connection portion 316 and the second level signal line 314' may be an integrated structure.

Figure 4:
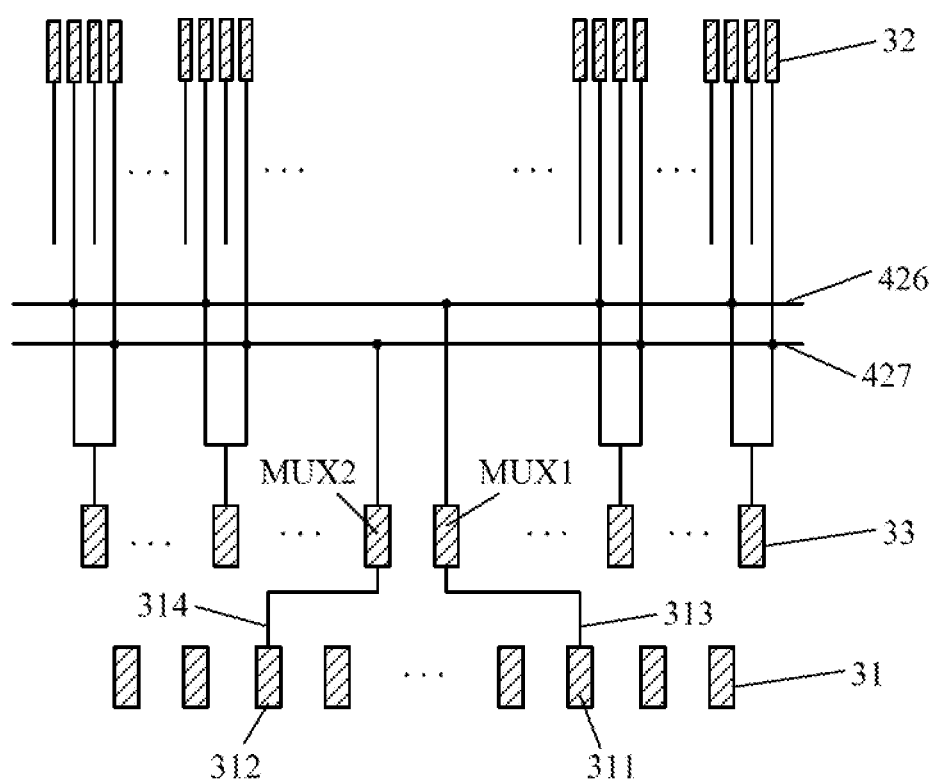
FIG. 4 is a schematic view of line connection relationships in the integrated circuit device layer area in FIG. 3.

The coupling mode described above keep the first control switch 424 and the second control switch 425 in the multiplexer 42 off when the integrated circuit device has an input signal (which may be a test signal or a normal operating signal). It may be seen from FIG. 3 and FIG. 4, the output terminal of the multiplexer 42 is coupled to the output terminal of the integrated circuit device, and thus, if the first control switch 424 and the second control switch 425 in the multiplexer 42 may not be kept off, a leakage current may occur, which may interfere the output signal (which may be a driving signal of a data line in an normal operation, and may be other test signals in the subsequent test stages) of the integrated circuit device. Therefore, the coupling mode described above may avoid interferences from the array test assembly 40 to the tests in the subsequent manufacturing stages or the operating signals of the finished products of the display apparatus. In the above example, both the first level signal and the second level signal may be high-level signals (VGH). However, it should be understood that designs of the first control switch 424 and the second control switch 425 in the multiplexer 42 may be various. For example, transistors may be divided into N-type transistors and P-type transistors according to the characteristics thereof. When the transistor is a P-type transistor, a turn-on voltage is a low-level voltage (for example, 0V, −5V, −10V or other suitable voltages), and a turn-off voltage is a high-level voltage (for example, 5V, 10V or other suitable voltages). When the transistor is an N-type transistor, a turn-on voltage is a high-level voltage (for example, 5V, 10V or other suitable voltage), and a turn-off voltage is a low-level voltage (for example, 0V, −5V, −10V or other suitable voltages). Therefore, if at least one of the first control switch 424 and the second control switch 425 adopts the N-type transistor, it may be designed to be turned off under control of a high-level signal (VGH), as described above, in this case, the corresponding first level signal and second level signal may be high-level signals (VGH). If at least one of the first control switch 424 and the second control switch 425 adopts the P-type transistor, it may be designed to be turned off under control of a low-level signal (VGL), in this case, at least one of the first level signal and second level signal may be a low-level signal (VGL)

(for example, a negative voltage signal with a voltage, for example, between −8V and −6V).

In some embodiments, the first control line 426, the second control line 427, the first level signal line 313, the second level signal line 314, the gate G1 of the first thin film transistor T1, and the gate G2 of the second thin film transistor T2 are made of a same material and are arranged on a same layer. This may simplify the process and save cost.

In some embodiments, the array test assembly 40 may further include: a high-level signal (VGH) line 51 (for example, used to provide a positive level signal (for example, with a voltage between 6V and 8V), which may also be referred to as a third-level signal line) a low-level signal (VGL) line (for example, used to provide a negative level signal (for example, with a voltage between −8V and −6V), which may also be referred to as a fourth-level signal line) 52; and a plurality of electrostatic discharge structures 43. The electrostatic discharge structure 43 is used to discharge static electricity in time to prevent an accumulation of the static electricity from damaging the array test assembly 40.

Figure 8:
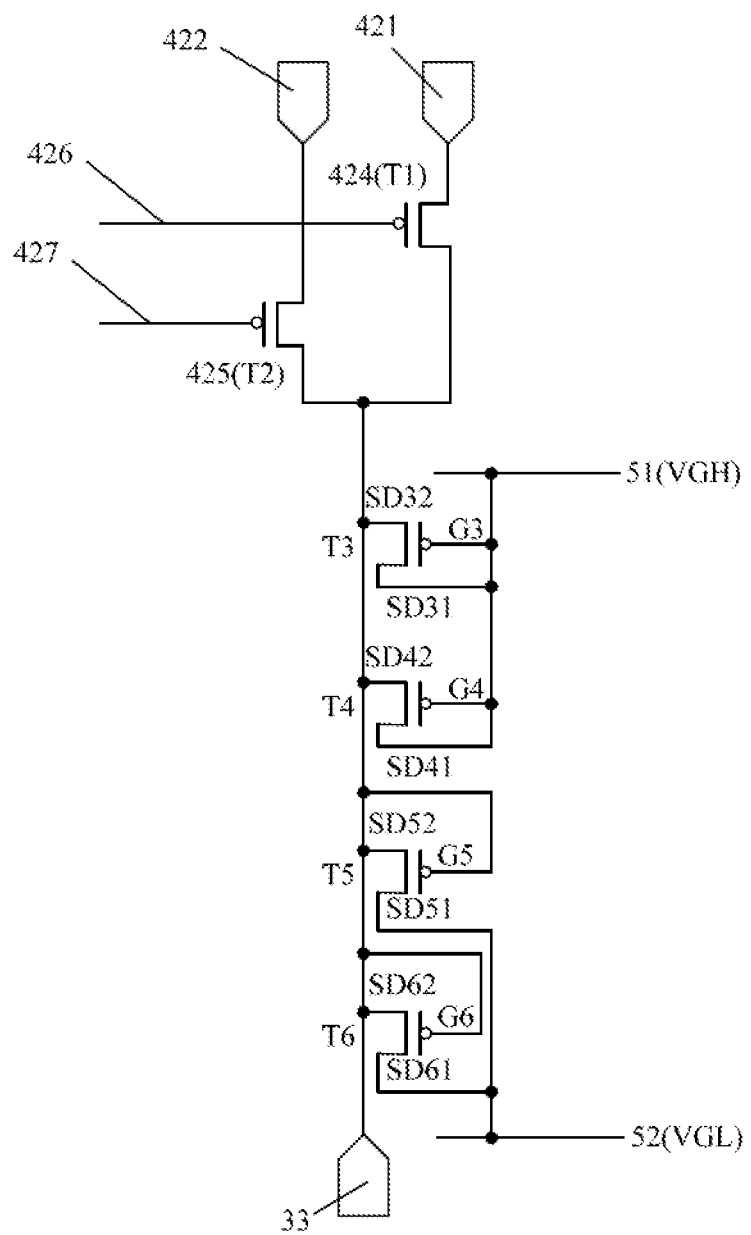
FIG. 8 schematically shows a circuit principle diagram of an array test assembly on a display substrate according to some embodiments of the present disclosure.

FIG. 8 shows a schematic diagram of a circuit structure corresponding to a single input channel in the array test assembly 40. The figure shows the multiplexer 42 and the electrostatic discharge structure 43. At least one electrostatic discharge structure 43 includes: a third thin film transistor T3, a fourth thin film transistor T4, a fifth thin film transistor T5, and a sixth thin film transistor T6. A gate G3 of the third thin film transistor T3 is electrically coupled to the high-level signal line 51, one SD31 of the source and drain of the third thin film transistor T3 is electrically coupled to the high-level signal line 51, another SD32 of the source and drain of the third thin film transistor T3 is electrically coupled to the corresponding input terminal of the array test assembly 40 (the corresponding pad in the plurality of third pads 33). A gate G4 of the fourth thin film transistor T4 is electrically coupled to the high-level signal line 51, one SD41 of the source and drain of the fourth film transistor T4 is electrically coupled to the high-level signal line 51, another SD42 of the source and drain of the fourth thin film transistor T4 is electrically coupled to the corresponding input terminal of the array test assembly 40 (the corresponding pad in the plurality of third pads 33). The fourth thin film transistor T4 and the third thin film transistor T3 may be coupled in parallel. A gate G5 of the fifth thin film transistor T5 is electrically coupled to the corresponding input terminal of the array test assembly 40 (the corresponding pad in the plurality of third pads 33), one SD51 of the source and drain of the fifth film transistor T5 is electrically coupled to the low-level signal line 52, another SD52 of the source and drain of the fifth thin film transistor T5 is electrically coupled to the corresponding input terminal of the array test assembly 40 (the corresponding pad in the plurality of third pads 33). A gate G6 of the fifth thin film transistor T6 is electrically coupled to the corresponding pad in the plurality of third pads 33, one SD61 of the source and drain of the sixth film transistor T6 is electrically coupled to the low-level signal line 52, and another SD62 of the source and drain of the sixth thin film transistor T6 is electrically coupled to the corresponding pad in the plurality of third pads 33.

It may be seen from FIG. 8 that a test signal line Signal is used to electrically couple the corresponding input terminal of the array test assembly 40 (that is, the corresponding pad in the plurality of third pads 33) to the input terminal 421 of the multiplexer 42. Since an electrostatic voltage on the test signal line Signal may be either a positive voltage or a negative voltage, in the embodiments of the present disclosure, two ways of discharging static electricity are provided for the test signal line Signal, that is, discharging static electricity to the high-level signal line 51 through the third thin film transistor T3 and the fourth thin film transistor T4, and discharging static electricity to the low-level signal line 52 through the fifth thin film transistor T5 and the sixth thin film transistor T6. When a voltage difference between a node on the test signal line Signal and the high-level signal line 51 is greater than a threshold voltage of the third thin film transistor T3 and the fourth thin film transistor T4, the third thin film transistor T3 and the fourth thin film transistor T4 may be turned on, so that the electrostatic voltage on the test signal line Signal is discharged to the high-level signal line 51. When a voltage difference between a node on the test signal line Signal and the low-level signal line 52 is greater than a threshold voltage of the fifth thin film transistor T5 and the sixth thin film transistor T6, the fifth thin film transistor T5 and the sixth thin film transistor T6 may be turned on, so that the electrostatic voltage on the test signal line Signal is discharged to the low-level signal line 52. The fourth thin film transistor T4 is located on a side of the third thin film transistor T3 away from the display area 10. The sixth thin film transistor T6 is located on a side of the fifth thin film transistor T5 away from the display area 10. The parallel structure of the fourth thin film transistor T4 and the third thin film T3 and the parallel structure of the sixth thin film transistor T6 and the fifth thin film transistor T5 are beneficial for increasing a discharge capability of the electrostatic discharge structure 43.

Figure 7:
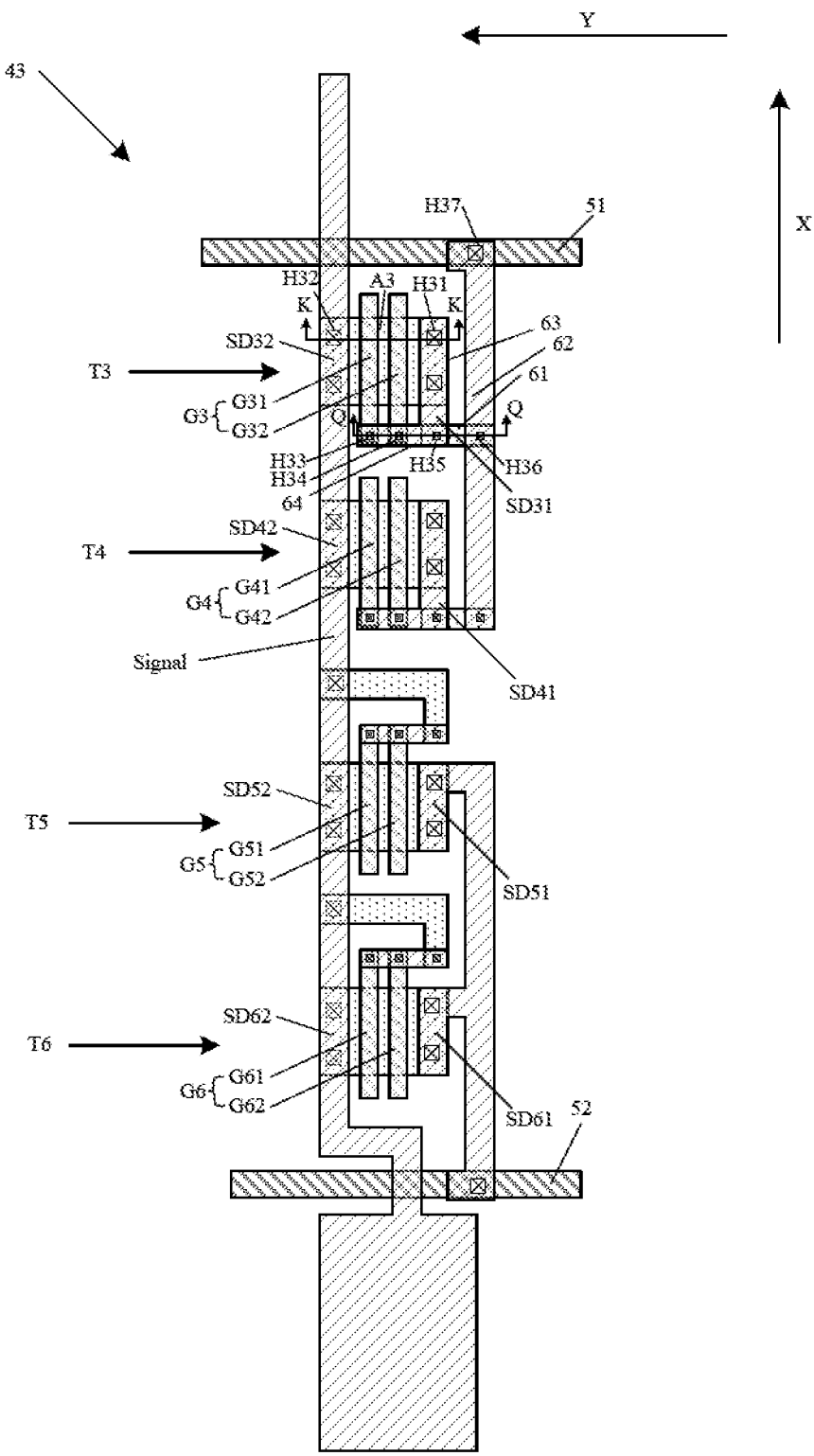
FIG. 7 is an enlarged view of a section F in FIG. 2.
Figure 9:
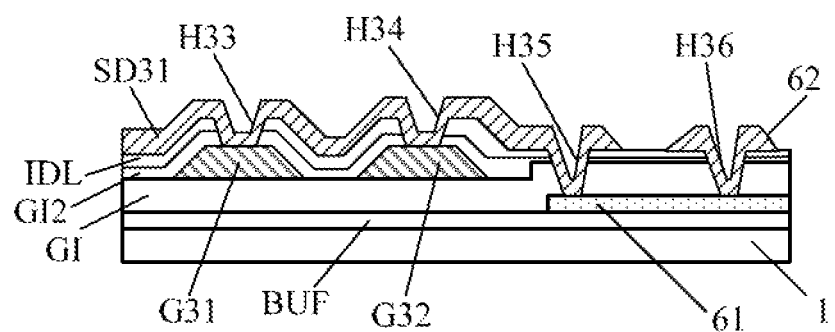
FIG. 9 is a schematic cross-sectional view taken along line Q-Q in FIG. 7.
Figure 10:
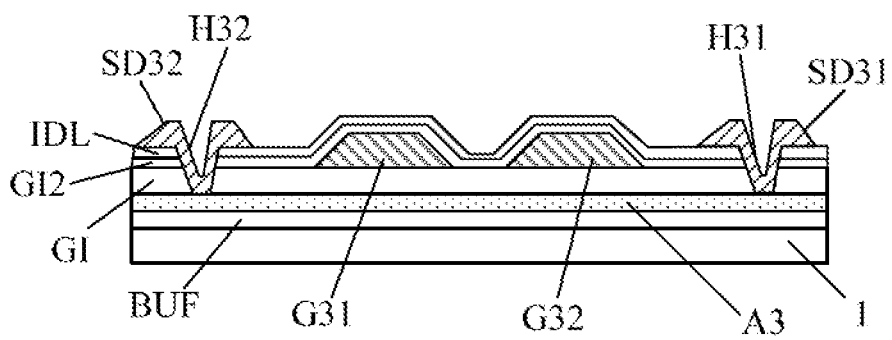
FIG. 10 is a schematic cross-sectional view taken along line K-K in FIG. 7.

In the following, the thin film transistor T3 is taken as an example to briefly describe the structure of the thin film transistor described above. As shown in FIG. 7, the third thin film transistor T3 includes an active layer A3, and an orthographic projection of the active layer A3 on the base substrate 1 may, for example, have a rectangular shape. As shown in FIGS. 7 and 10, one terminal of the active layer A3 is coupled to (for example, L-shaped) one SD31 of the source and drain of the third thin film transistor T3 through a via hole H31, another terminal of the active layer A3 is coupled to (for example, bar-shaped) another SD32 of the source and drain of the third thin film transistor T3 through a via hole H32. It may be seen from FIG. 10 that a gate insulating layer GI is provided on a side of the active layer A3 away from the base substrate 1, a gate G3 is provided on a side of the gate insulating layer GI away from the base substrate 1 (the gate G3 includes, for example, a first bar-like sub-gate G31 and a second bar-like sub-gate G32 arranged side by side), and an interlayer dielectric layer IDL is provided on a side of the gate G3 away from the base substrate 1. As an example, a second gate insulating layer GI2 may also be provided between the interlayer dielectric layer IDL and the gate G3. The one SD31 of the source and drain of the third thin film transistor T3 and the another SD32 of the source and drain of the third thin film transistor T3 are provided on a side of the interlayer dielectric layer IDL away from the base substrate 1. As an example, a buffer layer BUF may also be provided between the base substrate 1 and the active layer A3. FIG. 9 shows a cross-sectional view taken along line Q-Q in FIG. 7. FIG. 9 shows that the another SD32 of the source and drain of the third thin film transistor T3 is coupled to the first bar-like sub-gate G31 through a via hole H33, and is coupled to the second bar-like sub-gate G32 through a via hole H34, and is coupled to a first connection portion 61 through a via hole H35. The first connection portion 61 is further electrically coupled to a second connection portion 62 through a via hole H36, and the second connection portion 62 is further electrically coupled to the high-level signal line 51 through a via hole H37. Another SD32 of the source and drain of the third thin film transistor T3 may be, for example, formed by a part of the test signal line Signal. The one SD31 of the source and drain of the third thin film transistor T3 and the another SD32 of the source and drain of the third thin film transistor T3, the test signal line Signal, and the second connection portion 62 are made of a same material and are arranged on a same layer, and the first connection portion 61 and the active layer A3 are made of a same material and are arranged on a same layer, the first bar-like sub-gate G31 and the second bar-like sub-gate G32 and the high-level signal line 51 are made of a same material and are arranged on a same layer. The provision of the first connection portion 61 may increase resistances between the one SD31 (for example, the drain) of the source and drain of the third thin film transistor T3 and the high-level signal line 51, which is beneficial for preventing the third thin film transistor T3 from being damaged due to excessive discharge current. It may be seen from FIG. 7 that, the one SD31 of the source and drain of the third thin film transistor T3 has a first arm portion 63 and a second arm portion 64, the first arm portion 63 extends in a first direction (for example, x direction in the drawing), the second arm portion 64 extends in a second direction (for example, y direction in the drawing) crossing (for example, perpendicular to) the first direction (for example, x direction in the drawing). The first arm portion 63 is coupled to the active layer A3 through the via hole H31. The second arm portion 64 is coupled to the first bar-like sub-gate G31 through the via hole H33 and is coupled to the second bar-like sub-gate G32 through the via hole H34. As an example, similar to FIG. 9, a buffer layer BUF may also be provided between the base substrate 1 and the first connection portion 61. The interlayer dielectric layer IDL may be provided on a side of the gate G3 away from the base substrate 1. As an example, a second gate insulating layer GI2 may also be provided between the interlayer dielectric layer IDL and the gate G3.

Structures of other thin film transistors in the electrostatic discharge structure 43 are similar to that of the third thin film transistor T3, and may not be described one by one here. In some embodiments, gates of one, two, three, or four of the third thin film transistor T3, the fourth thin film transistor T4, the fifth thin film transistor T5, and the sixth thin film transistor T6 include a first bar-like sub-gate and a second bar-like sub-gate which are arranged side by side, one end of the first bar-like sub-gate is electrically coupled to one end of the second bar-like sub-gate (which may be directly coupled or coupled through structures such as via holes). This dual-sub-gate design may better improve a driving capability of the transistor.

In some embodiments, at least some of the plurality of second pads 32 are electrically coupled to the plurality of data lines DATA in the display area 10 (for example, with reference to FIG. 1), respectively. This is beneficial for testing the electrical properties of circuit units in the display area 10.

Figure 11:
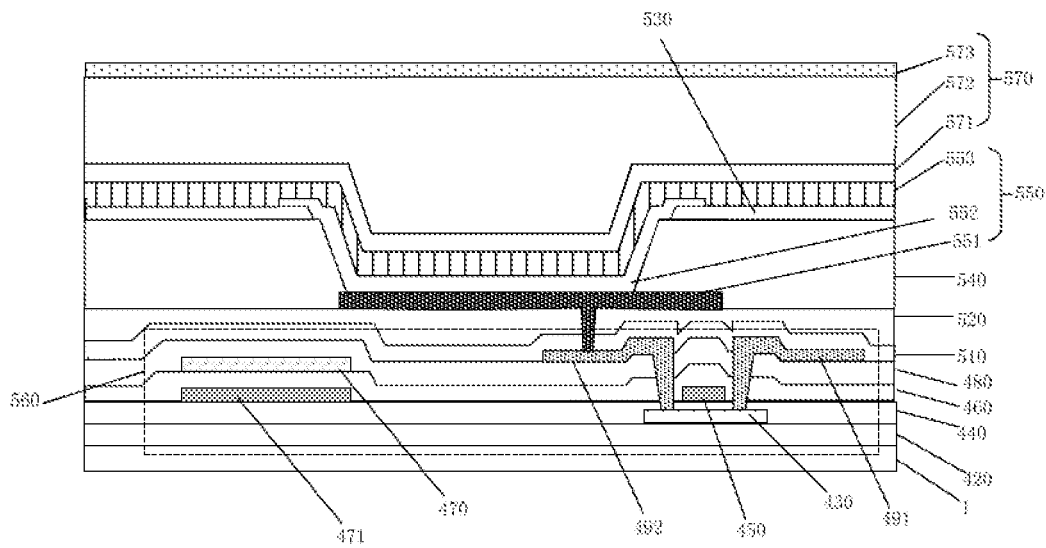
FIG. 11 is a schematic view of a film layer structure of a display area on a display substrate according to the embodiments of the present disclosure.

FIG. 11 schematically shows a film structure of the sub-pixel unit in the display area 10. As shown in FIG. 11, in some embodiments, at least one of the plurality of sub-pixels includes a pixel circuit 560 and a light-emitting element 550, and the pixel circuit 560 is located between the base substrate 1 and the light-emitting element 550. Limited by the drawing frame, only part of the pixel circuit 560 may be shown, which is shown in a dashed frame in FIG. 11.

The light-emitting element 550 includes a first electrode 553 (for example, a cathode), a light-emitting layer 552, and a second electrode 551 (for example, an anode) stacked in sequence, and the second electrode 551 is located on a side of the light-emitting layer facing the base substrate. The pixel circuit 560 includes at least one thin film transistor, the thin film transistor includes a gate 450 on the base substrate 1, a source 491 and a drain 492 on a side of the gate 450 away from the base substrate 1, and the source 491 or the drain 492 of the thin film transistor is electrically coupled to the second electrode 551. The source 491 and the drain 492 of the at least one thin film transistor are arranged on a same layer (a layer may be referred to as the source and drain layer) with the plurality of first pads 31, the plurality of second pads 32, and the plurality of third pads 33, and they may be formed by a same patterning process.

In some embodiments, the first level connection portion 315, the first level signal line 313', the second level connection portion 316, the second level signal line 314', and the gate 450 of the thin film transistor in the pixel circuit 560 are located on a same layer and may be formed by a same process.

In some embodiments, film structures of the sub-pixel unit may further include a buffer layer 420, an active layer 430, a first gate insulating layer 440, a second gate insulating layer 460, a second gate layer (a layer of the gate 450 described above may be referred to as a first gate layer), an interlayer dielectric layer 480, a passivation layer 510, a planarization layer 520, a pixel defining layer 540, and an encapsulation layer 570 on the base substrate 1 in sequence.

Specifically, the base substrate 1 is, for example, a flexible PI (polyimide) substrate made of transparent materials; the buffer layer 420 is made of transparent insulating materials such as silicon oxide, silicon nitride, etc.; the active layer 430 includes an active area of the thin film transistor in the pixel circuit, and may be made of semiconductor materials; the first gate insulating layer 440 may be made of transparent insulating materials such as silicon oxide, silicon nitride, etc.; the first gate layer may be made of metal materials, the gate 450 of the thin film transistor and a first electrode 471 of a storage electrode may be formed in the first gate layer; the second gate insulating layer 460 may be made of transparent insulating materials such as silicon oxide, silicon nitride, etc.; the second gate layer may be used to, for example, form a second electrode 470 of the storage electrode. The interlayer dielectric layer 80 is made of transparent insulating materials such as silicon oxide, silicon nitride, etc.; the source and drain layer is, for example, made of metal materials; the passivation layer 510 is made of transparent insulating materials such as silicon oxide, silicon nitride, etc.; the planarization layer 520 is made of transparent organic materials such as silicon oxide, silicon nitride, etc.; the pixel defining layer 540 is supported by transparent organic materials to define a light-emitting area in the sub-pixel unit, and may be formed by a patterning process. The encapsulation layer 570 includes a first inorganic encapsulation layer 571, an organic encapsulation layer 572, and a second inorganic encapsulation layer 573 away from the base substrate 1 in sequence, the first inorganic encapsulation layer 571, the organic encapsulation layer 572, and the second inorganic encapsulation layer 573 are stacked, and the encapsulation layer 170 is light-transparent.

Those skilled in the art should understand that, the structure shown in FIG. 11 is merely illustrative, which mainly shows the layer structure constituting the sub-pixel unit in the display area 10 of the OLED display substrate, and shows transmitting the signal of the pixel circuit to the light-emitting element through the thin film transistor to realize the light-emitting.

In some embodiments, as shown in FIG. 1, the display substrate may be a bendable substrate, the display substrate includes a foldable area 30, and the plurality of second pads 32 are far away from the display area 10 than the bendable area 30. Correspondingly, the plurality of first pads 31 and the plurality of third pads 33 are also far away, from the display area 10 than the bendable area 30. In this way, by folding the bendable area 30, the integrated circuit device layout area 40 including the plurality of first pads 31, the plurality of second pads 32, and the plurality of third pads 33 may be folded to a back side of the display screen, thereby reducing a frame width of the display apparatus.

In some embodiments, in a case that the integrated circuit device is installed in the integrated circuit device layout area 21, an orthographic projection of the integrated circuit device on the base substrate 1 at least partially overlaps an orthographic projection of the array test assembly 40 on the base substrate 1, which leads to the array test assembly 40 in the finished product to be totally covered by the integrated circuit device, and may not occupy excessive space. As an example, the orthographic projection of the integrated circuit device on the base substrate 1 may be consistent with the orthographic projection of the integrated circuit device layout area 21 on the base substrate 1.

In the embodiments of the present disclosure, the array test assembly 40 is a general term of a structure used for the AT test between the plurality of first pads 31 and the plurality of second pads 32. As stated above, the array test assembly 40 may include, for example, at least some of the plurality of third pads 33, the plurality of multiplexers 42, the high-level signal line 51, the lord-level signal line 52, the plurality of electrostatic discharge structures 43, the first level signal line 313, and the second level signal line 314, and the like.

In the embodiments of the present disclosure, a source of the thin film transistor and a drain of the thin film transistor may be used interchangeably. Therefore, in the above expression, expressions "one of the source and the drain" and "another of the source and the drain" are used to express one or another of the source and the drain, rather than distinguishing the source and the drain specifically.

Figure 12:
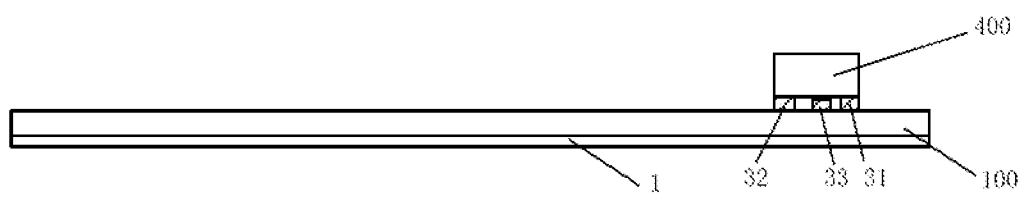
FIG. 12 is a schematic view of a display apparatus according to the embodiments of the present disclosure.

The embodiments of the present disclosure further provide a display apparatus. As shown in FIG. 12, the display apparatus may include the display substrate 100 and the integrated circuit device 400 according to any embodiment stated above, the integrated circuit device 400 is bound with the plurality of first pads 31 and the plurality of second pads 32.

In some embodiments, the orthographic projection of the integrated circuit device 400 on the base substrate 1 at least partially overlaps the orthographic projection of the plurality of third pads 33 on the base substrate 1, for example, totally overlaps the orthographic projection of the plurality of third pads 33 on the base substrate 1. This facilitates saving the wiring area of the display substrate.

In some embodiments, the plurality of multiplexers 42 may be configured to be turned off when the display apparatus is operating.

As an example, the display apparatus may be any product or component with a display function such as televisions, displays, digital frames, mobile phones, smart watches, tablet computers, etc.

The above description is only explanation to the exemplary embodiments of the present disclosure and the applied technical principles. Those skilled in the art should understand that the scope of the invention involved in the present disclosure is not limited to the technical solutions formed by the specific combination of the above technical features, and should also cover other technical solutions formed by any combination of the technical solutions described above and its equivalent features without departing from the concept. For example, the technical solution formed by mutually replacing the above-mentioned features and the technical features disclosed in the present disclosure (but not limited to) with similar functions.

What is claimed is:

1. A display substrate, comprising:
   a base substrate comprising a display area and a peripheral area surrounding the display area;
   a plurality of sub-pixel units in the display area;
   a plurality of data lines in the display area and electrically coupled to the plurality of sub-pixel units, respectively;
   a plurality of data transmission lines m the peripheral area on at least one side of the display area and electrically coupled to the plurality of data lines, respectively;
   a plurality of first pads and a plurality of second pads on a side of the plurality of data transmission lines away from the display area, wherein the plurality of first pads and the plurality of second pads extend in a direction of a boundary of the display area, respectively, and the plurality of second pads are located between the plurality of first pads and the plurality of data transmission lines and are electrically coupled to the plurality of data transmission lines;
   a plurality of third pads between the plurality of first pads and the plurality of second pads, wherein at least part of the plurality of third pads are electrically coupled to the plurality of second pads; and
   a plurality of multiplexers between the plurality of second pads and the plurality of third pads, wherein at least one of the plurality of multiplexers is electrically coupled to at least two of the plurality of second pads and one of the plurality of third pads.

2. The display substrate according to claim 1, wherein at least one of the plurality of multiplexers comprises: a first thin film transistor and a second thin film transistor, and the first thin film transistor comprises a first source, a first drain, and a first gate, the second thin film transistor comprises a second source, a second drain, and a second gate; and
   wherein one of the first source and the first drain and one of the second source and the second drain are electrically coupled to a same pad in the plurality of third pads, another of the first source and the first drain is electrically coupled to one of the plurality of second pads, another of the second source and the second drain is electrically coupled to another pad of the plurality of second pads; and
   wherein the first gate is electrically coupled to a first control line, the second gate is electrically coupled to a second control line, the first control line is configured to access a first level signal, the second control line is configured to access a second level signal, and the first level signal and the second level signal are configured to turn off the first gate and the second gate in the multiplexer during a display stage of the display substrate.

3. The display substrate according to claim 2, wherein the plurality of third pads further comprises:
   a first control terminal pad electrically coupled to the first control line; and a second control terminal pad electrically coupled to the second control line.

4. The display substrate according to claim 3, further comprising:
a first level signal line and a second level signal line between the plurality of first pads and the plurality of third pads, wherein the plurality of first pads comprise at least one first level input pad and at least one second level input pad, and the at least one first level signal line is electrically coupled to one of the first control terminal pad and the second control terminal pad and the at least one first level input pad, and the second level signal line is electrically coupled to another of the first control terminal pad and the second control terminal pad and the at least one second level input pad.

5. The display substrate according to claim 4, further comprising: a first level connection portion and a second level connection portion, wherein a number of the at least one first level input pad is multiple, and a number of the at least one second level input pad is multiple; and
wherein the first level connection portion is between the plurality of first level input pads and the first level signal line, and is electrically coupled to the first level signal line and the plurality of first level input pads; and the second level connection portion is between the plurality of second level input pads and the second level signal line, and is electrically coupled to the second level signal line and the plurality of second level input pads.

6. The display substrate according to claim 5, wherein the first level connection portion and the first level signal line are in an integrated structure, and the second level connection portion and the second level signal line are in an integrated structure.

7. The display substrate according to claim 6, wherein at least one of the plurality of sub-pixel units comprises a pixel circuit and a light-emitting element, the pixel circuit is between the base substrate and the light-emitting element; and
wherein the light-emitting element comprises a first electrode, a light-emitting layer, and a second electrode stacked in sequence, and the second electrode is located on a side of the light-emitting layer facing the base substrate; and
wherein the pixel circuit comprises at least one thin film transistor, the thin film transistor comprises a gate on the base substrate, a source and a drain on a side of the gate away from the base substrate, and the source or the drain of the thin film transistor is electrically coupled to the second electrode; and
the source and the drain of the at least one thin film transistor are arranged on a same layer with the plurality of first pads, the plurality of second pads, and the plurality of third pads.

8. The display substrate according to claim 5, wherein the first control line, the second control line, the first level signal line, the second level signal line, the gate of the first thin film transistor, and the gate of the second thin film transistor are made of a same material and are arranged on a same layer.

9. The display substrate according to claim 5, wherein at least one of the plurality of sub-pixel units comprises a pixel circuit and a light-emitting element, the pixel circuit is between the base substrate and the light-emitting element; and
wherein the light-emitting element comprises a first electrode, a light-emitting layer, and a second electrode stacked in sequence, and the second electrode is located on a side of the light-emitting layer facing the base substrate; and
wherein the pixel circuit comprises at least one thin film transistor, the thin film transistor comprises a gate on the base substrate, a source and a drain on a side of the gate away from the base substrate, and the source or the drain of the thin film transistor is electrically coupled to the second electrode; and
the source and the drain of the at least one thin film transistor are arranged on a same layer with the plurality of first pads, the plurality of second pads, and the plurality of third pads.

10. The display substrate according to claim 9, wherein the first level connection portion, the first level signal line, the second level connection portion, the second level signal line, and the gate of the thin film transistor in the pixel circuit are located on a same layer.

11. The display substrate according to claim 2, wherein the plurality of third pads are configured to input test signals to the plurality of sub-pixel units, and the plurality of first pads and the plurality of second pads are configured to be bound with a same integrated circuit device.

12. The display substrate according to claim 4, wherein the first level signal is a positive voltage signal or a negative voltage signal, and the second level signal is a positive voltage signal or a negative voltage signal.

13. The display substrate according to claim 12, wherein a numerical range of the positive voltage signal is between 6V to 8V and a numerical range of the negative voltage signal is between −8V to −6V.

14. The display substrate according to claim 1, wherein the plurality of third pads are configured to input test signals to the plurality of sub-pixels, and the plurality of first pads and the plurality of second pads are configured to be bound with a same integrated circuit device.

15. The display substrate according to claim 1, further comprising: a third level signal line and a fourth level signal line; and a plurality of electrostatic discharge structures, wherein the third level signal line is configured to provide a positive level signal, and the fourth level signal line is configured to provide a negative level signal, and
wherein at least one of the electrostatic discharge structures comprises:
a third thin film transistor, wherein a gate of the third thin film transistor is electrically coupled to the third level signal line, one of a source and a drain of the third thin film transistor is electrically coupled to the third level signal line, and another of the source and the drain of the third thin film transistor is electrically coupled to a corresponding pad in the plurality of third pads;
a fourth thin film transistor, wherein a gate of the fourth thin film transistor is electrically coupled to the third level signal line, one of a source and a drain of the fourth thin film transistor is electrically coupled to the third level signal line, and another of the source and the drain of the fourth thin film transistor is electrically coupled to a corresponding pad in the plurality of third pads;
a fifth thin film transistor, wherein a gate of the fifth thin film transistor is electrically coupled to a corresponded pad in the plurality of third pads, one of a source and a drain of the fifth thin film transistor is electrically coupled to the fourth level signal line, and another of the source and the drain of the fifth thin film transistor is electrically coupled to a corresponding pad in the plurality of third pads; and a sixth thin film transistor, wherein a gate of the sixth thin film transistor is electrically coupled to a corresponding pad in the plurality of third pads, one of a source and a drain of the sixth thin film transistor is electrically coupled to the fourth level signal line, and another of the source and the drain of the sixth thin film transistor is electrically coupled to a corresponding pad in the plurality of third pads.

16. The display substrate according to claim 15, wherein both the third thin film transistor and the fourth thin film transistor comprise an active layer; and wherein the gate of the third thin film transistor and the gate of the fourth thin film transistor comprise a first bar-like sub-gate and a second bar-like sub-gate; and wherein one of the source and the drain of each of the third thin film transistor and the fourth thin film transistor has a first arm portion and a second arm portion coupled to each other, the first arm portion extends in a first direction, and the second arm portion extends in a second direction crossing the first direction, the first arm portion is coupled to the active layer through a first via hole, and the second arm portion is coupled to the first bar-like sub-gate through a second via hole structure and is coupled to the second bar-like sub-gate through a third via hole.

17. The display substrate according to claim 16, wherein the electrostatic discharge structure further comprises: a first connection portion and a second connection portion; and wherein the first connection portion and the active layer are made of a same material and are arranged on a same layer, and the second connection portion and the source and the drain are made of a same material and are arranged on a same layer; and wherein the first connection portion is coupled to one of the source and the drain of each of the third thin film transistor and the fourth thin film transistor through the third via hole structure, the first connection portion is coupled to the second connection portion through a fourth via hole, and the second connection portion is coupled to the third level signal line through a fifth via hole structure.

18. The display substrate according to claim 1, wherein the display substrate is a bendable substrate, the display substrate comprises a bendable area, and the plurality of second pads are far away from the display area than the bendable area.

19. A display apparatus, comprising:

the display substrate according to claim 1; and an integrated circuit device, wherein the integrated circuit device is bound with the plurality of first pads and the plurality of second pads.

20. The display apparatus according to claim 19, wherein an orthographic projection of the integrated circuit device on the base substrate at least partially overlaps orthographic projections of the plurality of third pads on the base substrate.

* * * * *